United States Patent
Yeh et al.

(10) Patent No.: US 11,651,972 B2
(45) Date of Patent: May 16, 2023

(54) METHOD OF MANUFACTURING SEMICONDUCTOR DEVICES USING DIRECTIONAL PROCESS

(71) Applicant: TAIWAN SEMICONDUCTOR MANUFACTURING COMPANY, LTD., Hsinchu (TW)

(72) Inventors: Ya-Wen Yeh, Taipei (TW); Yu-Tien Shen, Tainan (TW); Shih-Chun Huang, Hsinchu (TW); Po-Chin Chang, Taichung (TW); Wei-Liang Lin, Hsinchu (TW); Yung-Sung Yen, New Taipei (TW); Wei-Hao Wu, Hsinchu (TW); Li-Te Lin, Hsinchu (TW); Pinyen Lin, Rochester, NY (US); Ru-Gun Liu, Zhubei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 89 days.

(21) Appl. No.: 17/403,850

(22) Filed: Aug. 16, 2021

(65) Prior Publication Data

US 2021/0375639 A1 Dec. 2, 2021

Related U.S. Application Data

(62) Division of application No. 16/383,539, filed on Apr. 12, 2019, now Pat. No. 11,094,556.

(Continued)

(51) Int. Cl.
*H01L 21/321* (2006.01)
*H01L 21/3213* (2006.01)
*H01L 21/66* (2006.01)

(52) U.S. Cl.
CPC .. *H01L 21/32137* (2013.01); *H01L 21/32139* (2013.01); *H01L 22/12* (2013.01); *H01L 22/26* (2013.01)

(58) Field of Classification Search
CPC ......... H01L 21/32137; H01L 21/32139; H01L 22/12; H01L 22/26

(Continued)

(56) References Cited

U.S. PATENT DOCUMENTS 10,451,585 B2 * 10/2019 Rearick .............. G01N 27/4145
2018/0151474 A1 * 5/2018 Chen ................... H01L 27/0629

(Continued)

OTHER PUBLICATIONS

Non-Final Office Action issued in U.S. Appl. No. 16/383,539, dated Dec. 23, 2020.

(Continued)

*Primary Examiner* — Jami Valentine Miller
(74) *Attorney, Agent, or Firm* — McDermott Will & Emery LLP

(57) ABSTRACT

In a method of manufacturing a semiconductor device, an underlying structure is formed over a substrate. A film is formed over the underlying structure. Surface topography of the film is measured and the surface topography is stored as topography data. A local etching is performed by using directional etching and scanning the substrate so that an entire surface of the film is subjected to the directional etching. A plasma beam intensity of the directional etching is adjusted according to the topography data.

20 Claims, 11 Drawing Sheets

Related U.S. Application Data

(60) Provisional application No. 62/692,230, filed on Jun. 29, 2018.

(58) Field of Classification Search
USPC .......................................................... 438/14
See application file for complete search history.

(56) References Cited

U.S. PATENT DOCUMENTS

| | | | |
|---|---|---|---|
| 2018/0269271 A1* | 9/2018 | Chung | H01L 28/60 |
| 2020/0006085 A1* | 1/2020 | Yeh | H01J 37/00 |

OTHER PUBLICATIONS

Notice of Allowance issued in U.S. Appl. No. 16/383,539, dated Apr. 16, 2021.

* cited by examiner

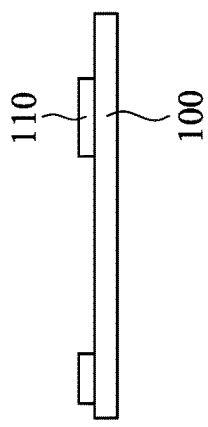
FIG. 5B
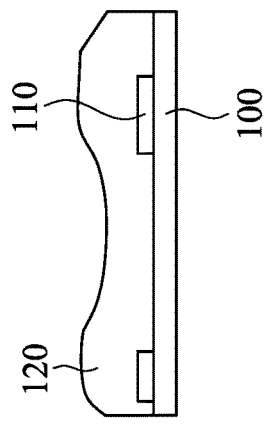
FIG. 5C
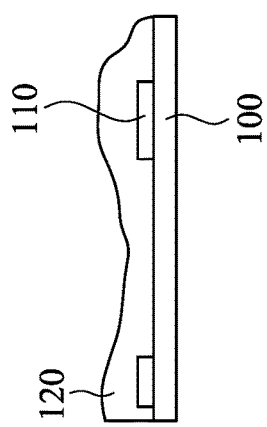
FIG. 5D
FIG. 5E
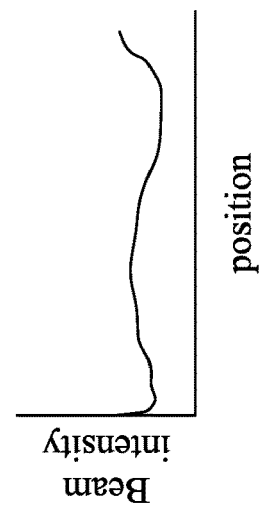
FIG. 5F
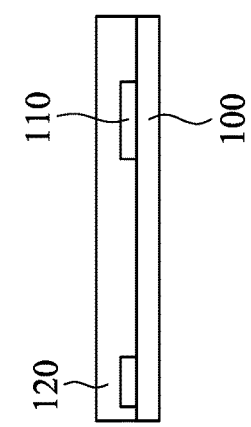
FIG. 5G

METHOD OF MANUFACTURING SEMICONDUCTOR DEVICES USING DIRECTIONAL PROCESS

RELATED APPLICATIONS

This application is divisional of U.S. patent application Ser. No. 16/383,539 filed Apr. 12, 2019, now U.S. Pat. No. 11,094,556 which claims priority of U.S. Provisional Patent Application No. 62/692,230 filed Jun. 29, 2018, the entire contents of each of which are incorporated herein by reference.

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology (SPT) is about 28 nm to about 34 nm. To obtain smaller pitch patterns, a double-patterning technology (DPT) with twice repeating lithography exposure processes will be needed for patterning of a L/S pitch smaller than about 32 nm. However, the cost of EUV with the DPT approach would be too expensive for a mass-production application.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5B, 5C, 5D and 5G show cross sectional views of the various stages of semiconductor device manufacturing operations in accordance with an embodiment of the present disclosure. FIG. 5E shows a topography and FIG. 5F shows a plasma beam intensity according to an embodiment of the present disclosure.

DETAILED DESCRIPTION

Figure 1A:
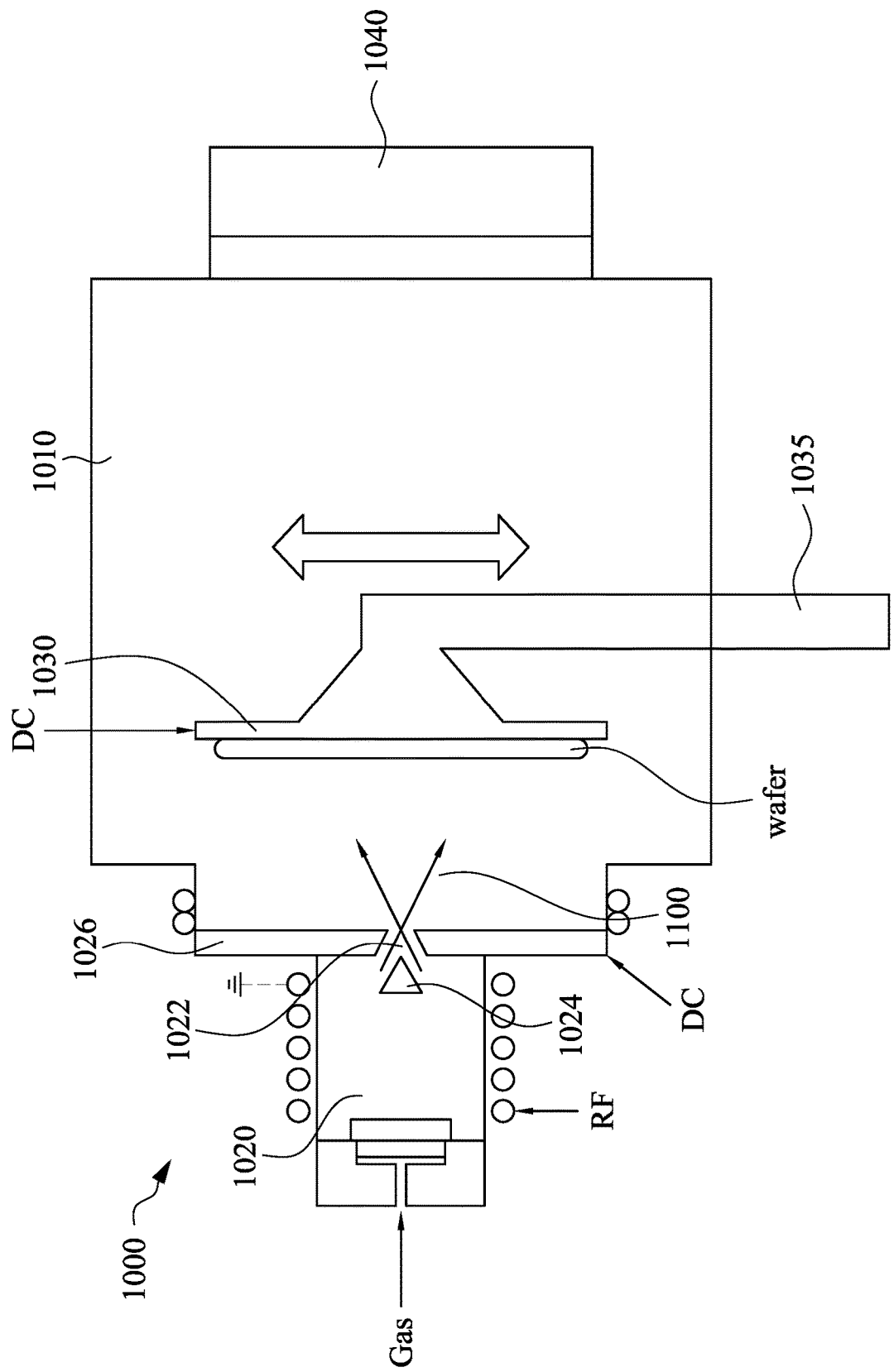
FIG. 1A shows a schematic view of a directional patterning apparatus in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure.

In the present disclosure, a directional patterning technique using a single-exposure patterning technology (SPT) will be explained to obtain a pattern pitch smaller than the lithography resolution limit, e.g., smaller than about 32 nm.

A directional patterning technique includes a directional etching technique and a directional deposition technique. The directional etching can be characterized as horizontal or surface anisotropic or selective etching, in which a target layer or pattern is etched substantially in only one direction (e.g., X direction) within a plane (X-Y plane) parallel to a substrate, without substantially etching another direction (e.g., Y direction).

A directional etching can be performed by tuning various etching parameters to generate etching species (free radicals) that travel in a substantially horizontal direction or that incident on the substrate with a large incident angle of more than about 10-30 degrees (where an angle of 90 degrees is horizontal). The etching parameters to be tuned include, but are not limited to, etchant (gas) composition, etching temperature, etching time, etching pressure, radio frequency (RF) bias voltage, RF bias power, etchant flow rate, wafer tilting, other suitable etching parameters, or combinations thereof.

Figure 1C:
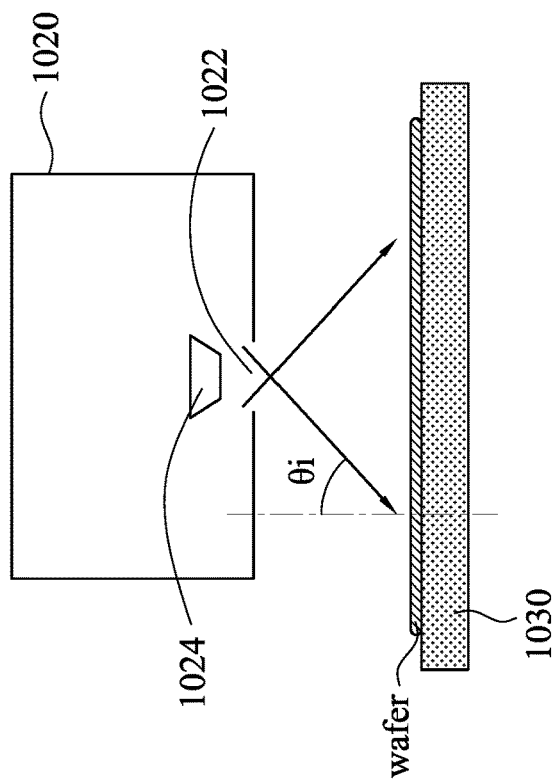
FIGS. 1B, 1C and 1D show schematic views of directional patterning in accordance with an embodiment of the present disclosure.
Figure 1B:
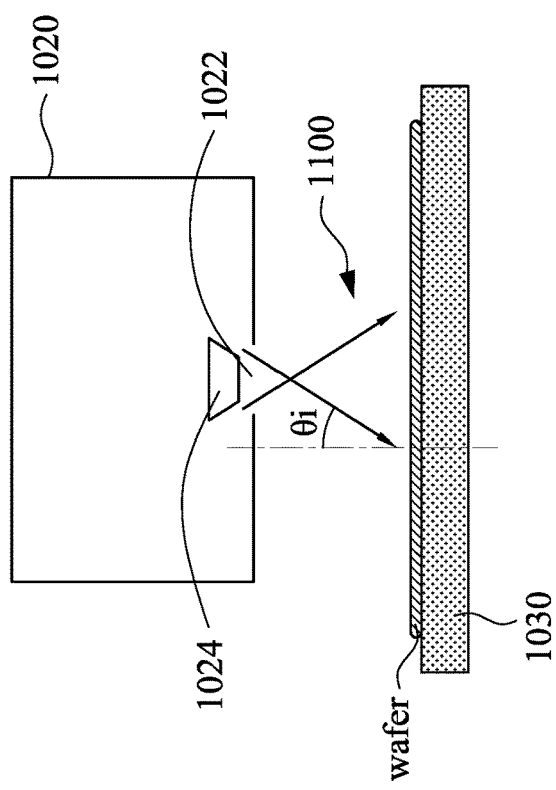
Figure 1D:
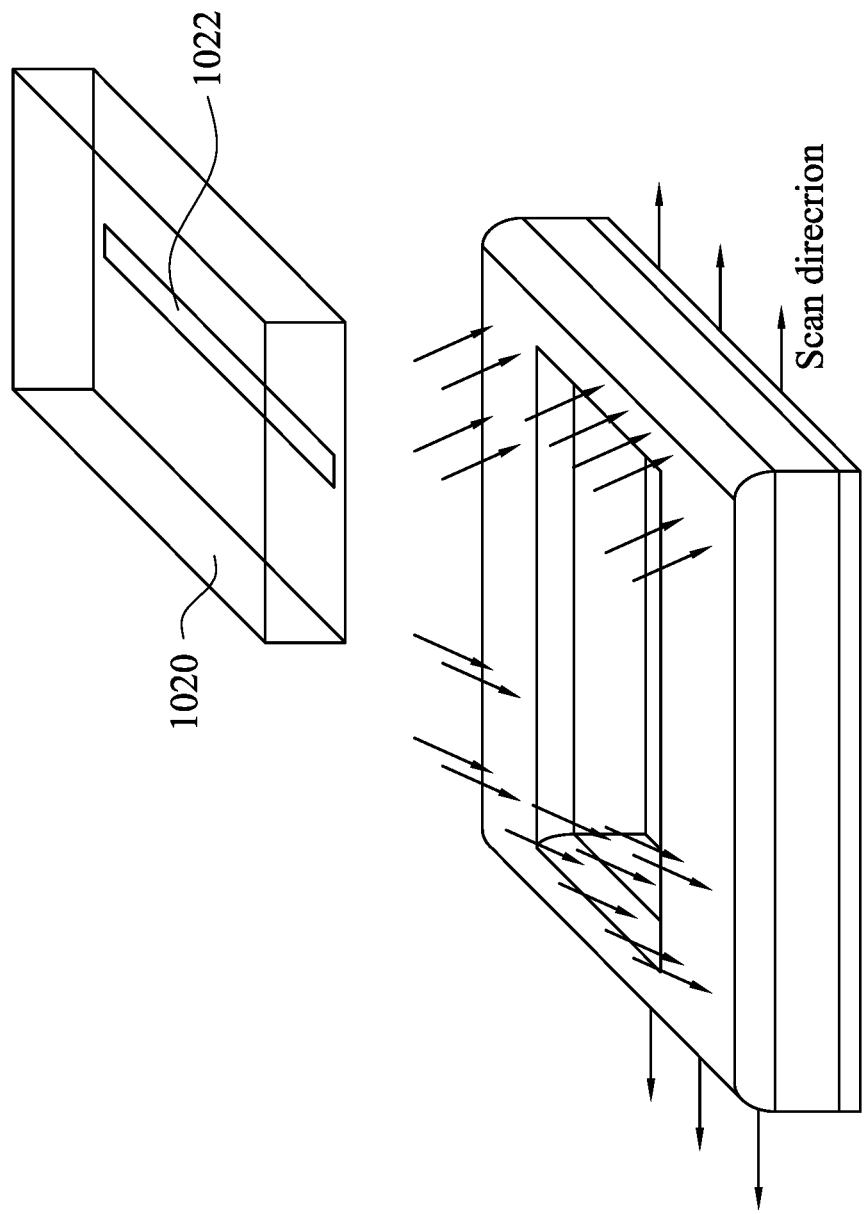

FIG. 1A shows a schematic view of a directional patterning apparatus, and FIGS. 1B, 1C and 1D show schematic views of directional patterning in accordance with an embodiment of the present disclosure.

As shown in FIG. 1A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain reduced pressure states in the chambers. In some embodiments, during the etching process, the pressure in the main chamber is lower than the pressure in the plasma chamber. In certain embodiments, the pressure in the main chamber is in the order to $1 \times 10^{-5}$ Torr, and the pressure in the plasma chamber is in the order to $1 \times 10^{-3}$ Torr.

In some embodiments, the separation plate 1026 and the wafer stage 1030 are biased by DC voltage, respectively, to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species alone the etching front.

In some embodiments, as shown in FIGS. 1B and 1C, a position of the meniscus 1024 is adjusted to change the incident angle θi of the plasma beams 1100. As shown in FIG. 1D, by scanning the wafer along the X direction, a groove pattern can be formed without substantially expanding the groove in the Y direction.

FIGS. 2A-4B shows plan views and cross sectional views of various stages for manufacturing a semiconductor device in accordance with another embodiment of the present disclosure. It is understood that additional operations can be provided before, during, and after processes shown by FIGS. 2A-4B, and some of the operations described below can be replaced or eliminated, for additional embodiments of the method. The order of the operations/processes may be interchangeable. In FIGS. 2A-4B, the "A" figures are plan views (viewed from the above) and the "B" figures are cross sectional views corresponding to line L1-L1 of FIG. 2A.

Figure 2A:
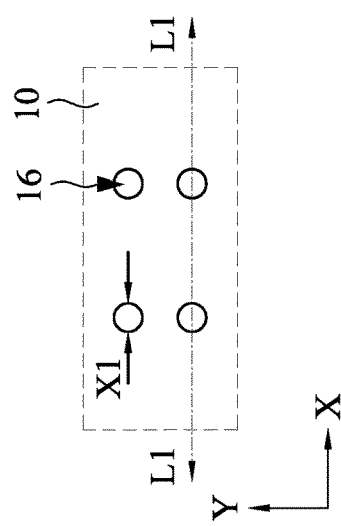
FIG. 2A illustrates a plan view of one of the various stages of manufacturing operations in accordance with an embodiment of the present disclosure.
Figure 3A:
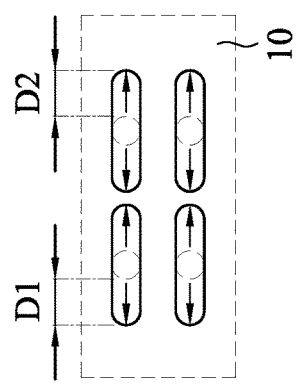
FIG. 3A illustrates a plan view of one of the various stages of manufacturing operations in accordance with an embodiment of the present disclosure.
Figure 4A:
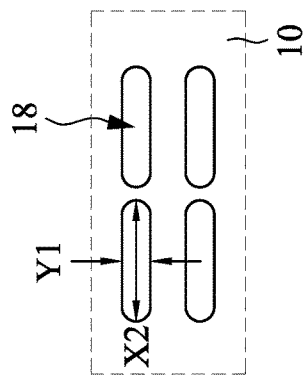
FIG. 4A illustrates a plan view of one of the various stages of manufacturing operations in accordance with an embodiment of the present disclosure.
Figure 2B:
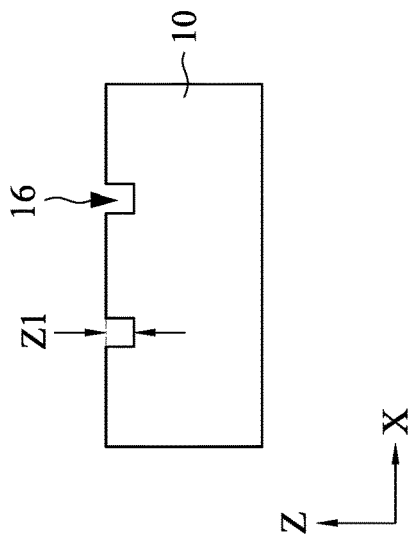
FIG. 2B illustrates a cross sectional view corresponding to line L1-L1 of FIG. 2A.
Figure 3B:
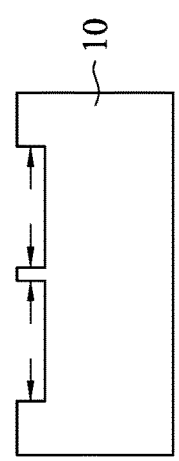
FIG. 3B illustrates a cross sectional view corresponding to line L1-L1 of FIG. 3A.
Figure 4B:
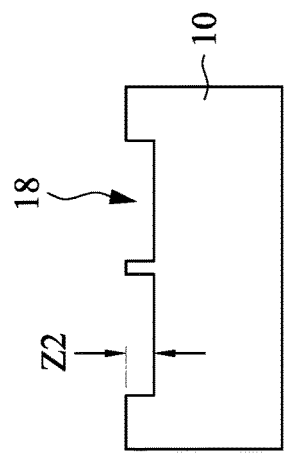
FIG. 4B illustrates a cross sectional view corresponding to line L1-L1 of FIG. 4A.

In some embodiments, hole patterns 16 are formed in the surface portion of a target layer 10, by one or more lithography and etching operations, as shown in FIGS. 2A and 2B. In other embodiments, space patterns having an elongated rectangular shape are formed instead of hole patterns. The target layer 10 is a dielectric layer, a conductive layer, a semiconductor layer or any other layers utilized in semiconductor fabrication. The hole pattern 16 has a diameter X1 and a depth Z1, as shown in FIG. 2B. Then, one or more directional etching operations in the X direction are performed, to enlarge the hole patterns 16 by an amount D1 and an amount D2, thereby forming trenches 18, as shown in FIGS. 3A and 3B and FIGS. 4A and 4B. In some embodiments, D1 is equal to D2 and in other embodiments, D1 is different from D2. The trench 18 has a length X2, a width Y1 and a depth Z2, as shown in FIGS. 4A and 4B. The length X2 is equal to X1+D1+D2. The difference Dy between widths Y1 and X1 is equal to or greater than zero and smaller than (D1+D2)/2. In some embodiments, (D1+D2)/2 is two times or more, five times or more, or ten times or more Dy. In some embodiments, Z2 is greater than Z1 and ½ or less, ⅕ or less or 1/10 or less (D1+D2)/2.

In some embodiments, in the directional etching, a ratio of an amount of etching in the X direction to an amount of etching in the Y direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments.

As set forth above, the directional etching is a local etching which is performed on only a partial area of the substrate (wafer). In some embodiments, the width of the area corresponds to the width of the slit 1022 along the Y direction shown in FIG. 1D. In some embodiments, the width is in a range from about 5 mm to about 50 mm. The width can be change by using, for example, a mechanical shutter. The length of the area along the X direction can be adjusted by the adjustable meniscus 1024 as shown in FIGS. 1B and 1C, and is in a range from about 5 mm to about 50 mm in some embodiments. In some embodiments, the etching area has a square shape or a rectangular shape.

Figure 5A:
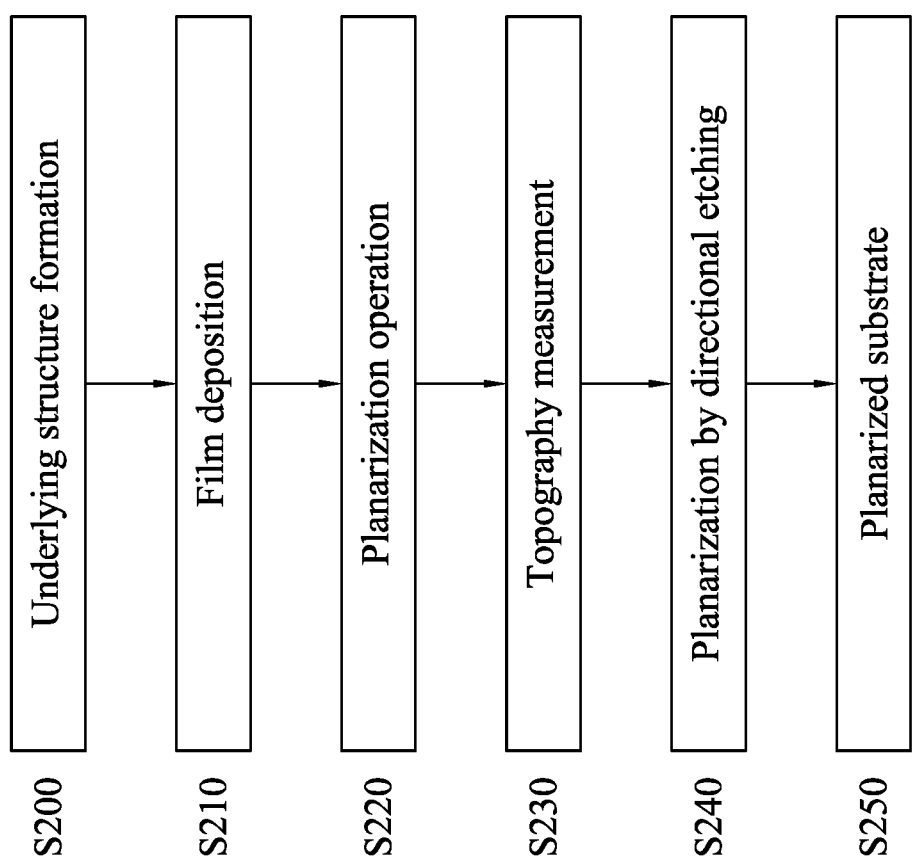
FIG. 5A illustrates a flow chart of semiconductor device manufacturing operations in accordance with an embodiment of the present disclosure.

FIG. 5A shows a flow and FIGS. 5B-5G show various stages of a manufacturing operation for a semiconductor device according to an embodiment of the present disclosure. It is understood that additional operations can be provided before, during, and after processes shown by FIGS. 5A-5G, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-4B may be employed in the following embodiments, and some of the explanations may be omitted.

As shown in FIGS. 5A and 5B, in S200, one or more underlying structures 110 are formed over a substrate 100. In some embodiments, the substrate 100 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

The underlying structures 110 include various devices, structures, layers and/or elements. Examples of the underlying devices may include static random access memories (SRAMs) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device.

Then, as shown in FIG. 5C, at S210, one or more films 120 are formed over the underlying structures 110. In some embodiments, the films 120 are one or more interlayer dielectric (ILD) layers. The interlayer dielectric layer includes silicon oxide, silicon nitride, silicon oxynitride (SiON), SiOCN, SiOC, SiCN, fluorine-doped silicate glass (FSG), aluminum oxide, an organic material, or a low-k dielectric material, or any other suitable dielectric material. The interlayer dielectric layer may be formed by chemical vapor deposition (CVD), physical vapor deposition (PVD), atomic layer deposition (ALD), or other suitable film forming processes. In some embodiments, the film 120 includes a semiconductor layer, such as polysilicon and amorphous silicon, or a conductive layer, such as a metallic layer. The semiconductor layer can be formed by CVD, ALD, molecular beam epitaxy or any other suitable film formation methods. The metallic layer is made of one or more of Al, Cu, W, Co, Ni, Mo, Ti, Ta and an alloy thereof, TiN, TaN or other suitable conductive material. The conductive layer can be formed by CVD, PVD, ALD, electro-plating or any other suitable film formation methods.

After the film 120 is formed, the film 120 often has an uneven topography including convex portions (protrusions, mesas and/or hills) and/or concave portions (recesses, grooves, trenches, openings, holes and/or spaces), as shown in FIG. 5C. Further, there are different areas having different ratios of concave portions.

The film 120 with an uneven topography is subjected to a planarization process, such as an etch back process and/or a chemical mechanical polishing process, in some embodiments, at S220 of FIG. 5A. Even after the planarization operation, the film 120 still has an uneven topography as shown in FIG. 5D.

Then, at S230 of FIG. 5A, a surface topography of the film 120 is measured over the entire substrate 100. Due to process variation in film deposition, etching and/or polishing (planarization) processes, the surface of the film 120 may have an uneven topography (i.e., not being flat). Such a topography is measured and recorded as surface topography data in a memory. The surface topography can be measured by, for example, an optical method or atomic force microscopy. FIG. 5E is a surface topography with respect to a position in a wafer along one line.

Then, at S240 of FIG. 5A, one or more directional etching operations are performed on a local area by varying beam intensity according to the surface topography data. For example, the beam intensity is increased for a portion having a higher uneven topography (e.g., a higher thickness), while the beam intensity is reduced for a portion having a lower uneven topography (e.g., a smaller thickness). FIG. 5F shows a beam intensity variation along the one line corresponding to FIG. 5E. As shown in FIG. 5F, the beam intensity has a reverse profile with respect to the surface topography. By using such local directional etching operations, it is possible to obtain a substantially flat surface as shown in FIG. 5G.

In some embodiments, measuring the surface topography S230 and performing directional etching S240 are repeated to obtain a desired flatness of the film 120. In some embodiments, the initial planarization operation S220 is not performed, and the surface topology measurement is performed on the film 120 as deposited.

Figure 6:
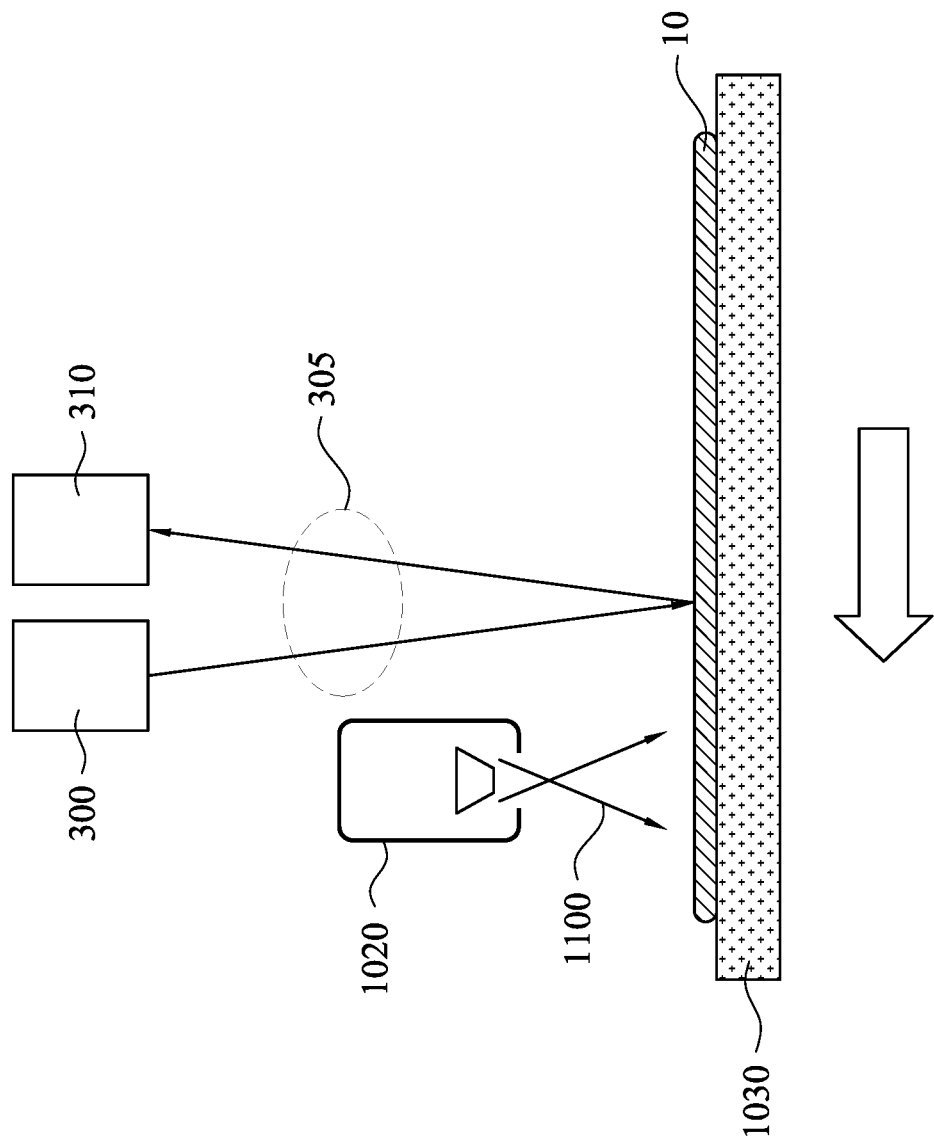
FIG. 6 shows a schematic view of semiconductor device manufacturing operations in accordance with an embodiment of the present disclosure.

FIG. 6 shows a schematic view of a planarization operation according to an embodiment of the present disclosure. In the foregoing embodiments, the surface topography for the entire substrate (wafer) is obtained and stored, and then the directional etching operation is performed by moving the wafer relative to the plasma beam while varying the plasma beam intensity based on the surface topography data. In the embodiment of FIG. 6, the surface topography is measured in-situ followed by a directional etching operation. In some embodiments, an optical beam 305 emitted from a beam source 300 is applied to the surface of the substrate 10 (e.g., surface of a film formed thereon), and a reflected optical beam is received by a receiver 310, thereby measuring surface topography of the substrate 10. In some embodiments, the optical beam 305 is a laser light. The substrate 10 moves relative to the optical beam 305 as shown by the arrow in FIG. 6. In some embodiments, the stage 1030 on which the substrate 10 is mounted moves. The measured surface topography is provided to modulate the plasma beam 1100 extracted from the plasma chamber 1020.

Figure 7:
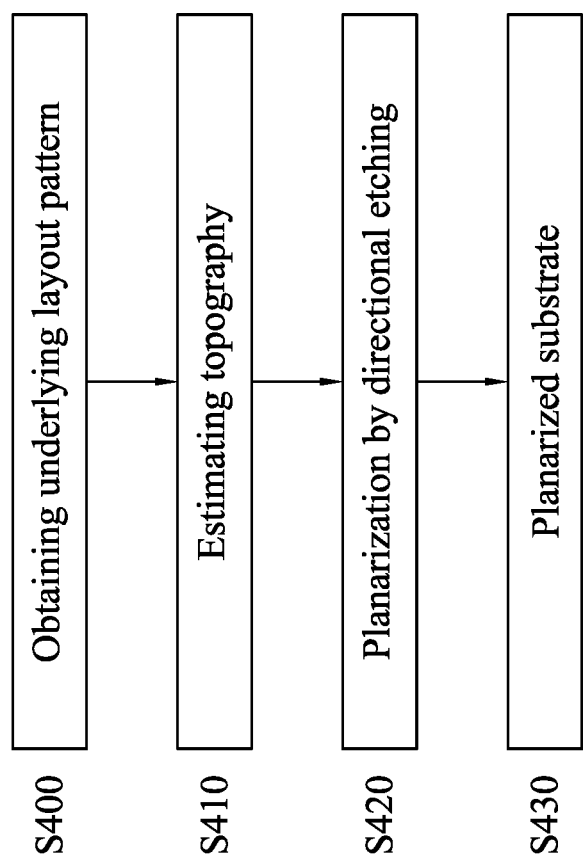
FIG. 7 illustrates a flow chart of semiconductor device manufacturing operations in accordance with an embodiment of the present disclosure.

FIG. 7 shows a flow of a manufacturing operation for a semiconductor device according to an embodiment of the present disclosure. It is understood that additional operations can be provided before, during, and after the operations shown by FIG. 7, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-6 may be employed in the following embodiments, and some of the explanations may be omitted.

In the embodiments described with respect to FIGS. 5A-5G and 6, a surface topography is measured and stored as surface topography data and the plasma beam intensity in the directional etching operation is adjusted based on the surface topography data. In other embodiments, the surface topography is optionally estimated or predicted by using layout data of the underlying patterns. The surface topography after a film is formed over the underlying patterns depends on a pattern density of the underlying patterns in some embodiments. For example, when the pattern density is low or no pattern is formed in a given area, the thickness of the film after a CMP operation becomes thinner due to "dishing" compared with other areas having a high pattern density. In the embodiment of FIG. 7, at S400, the pattern layout data of one or more layers of the underlying structure are obtained. Then, at S410, by analyzing the pattern layout data using one or more processors (computers), a surface topography after a film is formed over the underlying patterns is estimated. In some embodiments, the surface topography after the film is further subjected to a CMP operation is estimated. In some embodiments, the film thickness and/or material of the film are also considered when estimating the surface topography.

Then, at S420, a directional etching operation is performed by varying the plasma beam intensity according to the estimated surface topography. Similar to S250 of FIG. 5A, a substantially flat surface of the film is obtained at S430.

Figure 8B:
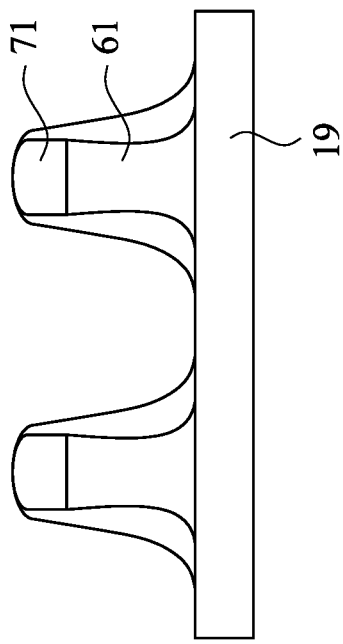
FIGS. 8A and 8B illustrate cross sectional views of one of the various stages of manufacturing operations in accordance with an embodiment of the present disclosure.
Figure 8A:
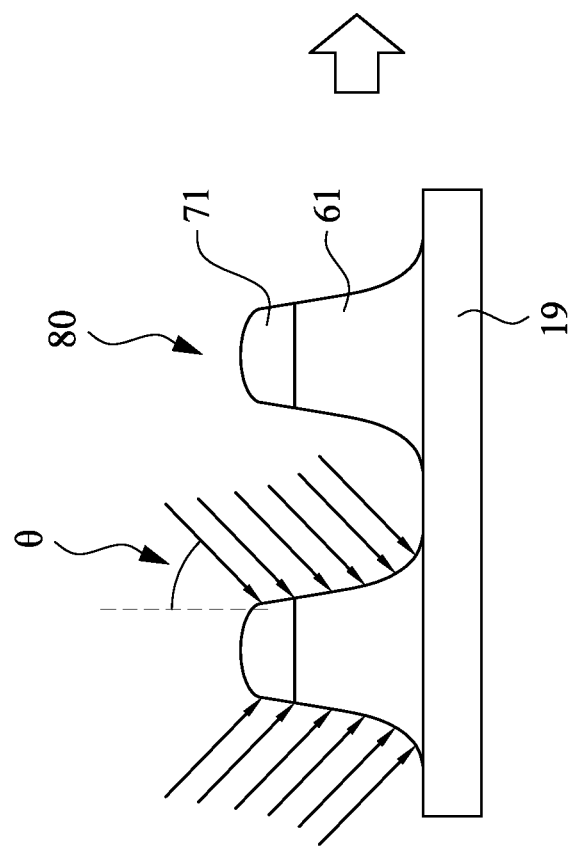

FIGS. 8A and 8B show an advantageous effect of the use of two hard mask layers and a directional etching operation in accordance with an embodiment of the present disclosure. Materials, configurations, dimensions, structures, conditions and operations the same as or similar to those explained with respect to FIGS. 1A-7 may be employed in the following embodiments, and some of the explanations may be omitted.

As shown in FIG. 8A, a mask pattern 80 includes a first hard mask layer 61 formed over a dielectric layer 19, and a second hard mask layer 71 formed over the first hard mask layer 61. In some embodiments, the second hard mask layer 71 is one of the layers used in a multilayer resist system in a lithography operation, and is made of an organic material. The first hard mask layer is made of silicon oxide formed from tetraethyl orthosilicate (TEOS) or silicon nitride.

As shown in FIG. 8A, a plasma flow having an oblique angle θ (plasma incident angle) with respect to the normal direction is applied. By adjusting the angle θ and/or an etching selectivity between the first hard mask layer 61 and the second hard mask layer 71, it is possible to modify a pattern profile (vertical profile) of the mask pattern 80, as shown in FIG. 8B.

In some embodiments, due to lithography and/or etching conditions, the pattern profile of the mask pattern 80 has a tapered shaped. In some embodiments, the plasma incident angle θ is set to about 5 to about 15 degrees to remove the tapers from the mask pattern 80. When the plasma incident angle θ is smaller than 5 degrees, an etching amount of the side of the first mask layer 61 would be small, and when the plasma incident angle θ is greater than 30 degrees, the pattern profile of the mask pattern 80 would be a T-shape.

FIGS. 9A to 11B show a process of defect removal by directional etching in accordance with an embodiment of the present disclosure. In FIGS. 9A-11B, the "A" figures are cross sectional views and the "B" figures are plan views (views from above). It is understood that additional operations can be provided before, during, and after processes shown by FIGS. 9A-11B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-8 may be employed in the following embodiments, and some of the explanations may be omitted.

Figure 9A:
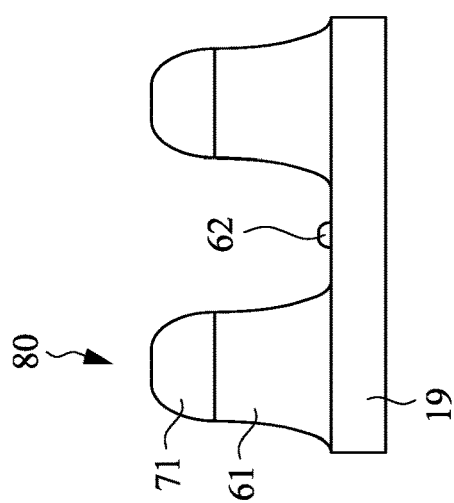
FIGS. 9A and 9B illustrate views of one of the various stages of manufacturing operations in accordance with an embodiment of the present disclosure.
Figure 9B:
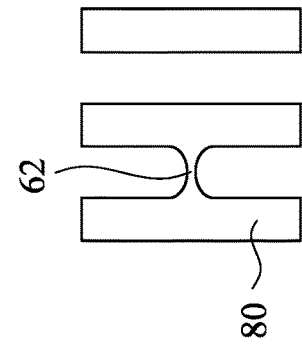

By applying directional etching, it is possible to remove a defect without substantially affecting the main patterns (widths etc.). As shown in FIGS. 9A and 9B, due to various reasons, a defect 62 is formed between two main patterns 80. The defect 62 is caused by, for example, a resist scum or a particle caused during film formation and/or etching operations. In some embodiments, the defect 62 is a bridging defect as shown in FIG. 9B. Such a defect can be detected by using a defect inspection apparatus. The defect inspection apparatus can detect one or more defects and their location (coordinates) within a wafer. The location, size and/or other information relating to the defects are stored in a memory as defect data.

Figure 11A:
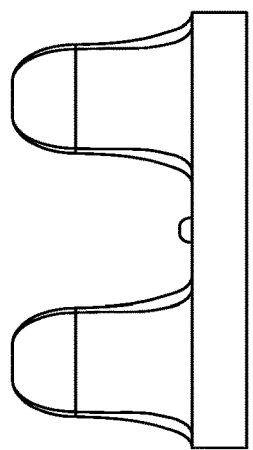
FIGS. 11A and 11B illustrate views of one of the various stages of manufacturing operations in accordance with an embodiment of the present disclosure.
Figure 11B:
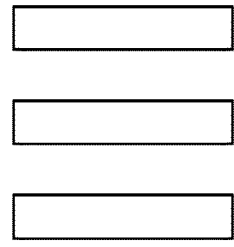
Figure 10A:
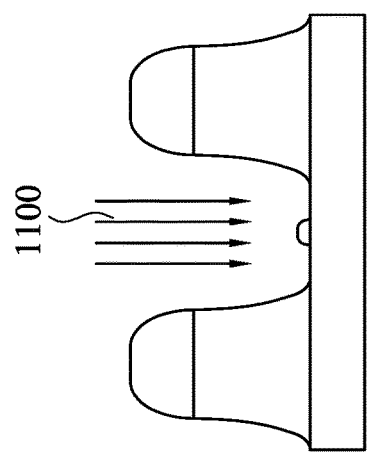
FIGS. 10A and 10B illustrate views of one of the various stages of manufacturing operations in accordance with an embodiment of the present disclosure.
Figure 10B:
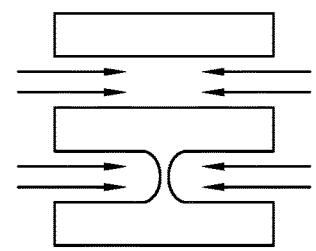

Then, one or more directional etching is performed to remove the defect 62 as shown in FIGS. 10A and 10B. In some embodiments, the directional etching is locally performed on the area around the defect 62 is detected based on the defect data. By adjusting the direction of the directional etching, for example, parallel to the main patterns 80, as shown in FIGS. 10A and 10B, the defect 62 can be etched away substantially without reducing the width of the main patterns 80, as shown in FIGS. 11A and 11B.

Further, in some embodiments, the pattern 80 is a two-layer pattern having a first hard mask layer 61 and a second hard mask layer 71 similar to FIGS. 8A and 8B. When the hard mask layer 61 is made of a material having a higher etching rate than the hard mask layer 71, it is possible to selectively remove a defect or etching residue formed by the hard mask layer 61 with respect to the hard mask layer 71.

In the foregoing embodiments, defects on a wafer are detected by a wafer pattern defect inspection apparatus and the defects are removed by using directional etching. In other embodiments, the defect removal technology by using directional etching is applied to a photo mask manufacturing operation. Similar to a pattern formation operation over a wafer, a circuit pattern is formed over a transparent substrate by using electron beam lithography and etching operations. In an extreme ultra violet lithography process, a reflective photo mask is used.

During the patterning operations, a defect may occur in the photo mask pattern. By using a photo mask defect inspection apparatus, defects can be detected and their location and other information are stored in a memory. By applying the directional etching and considering the pattern direction, it is possible to selectively remove the defects without affecting the circuit patterns.

Figure 14:
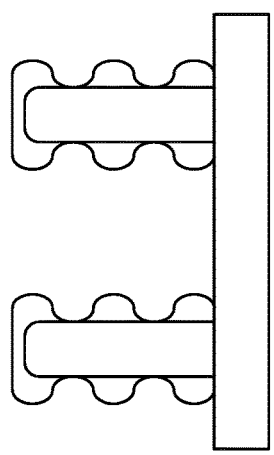
FIGS. 12, 13 and 14 illustrate cross sectional views of the various stages of manufacturing operations in accordance with an embodiment of the present disclosure.
Figure 13:
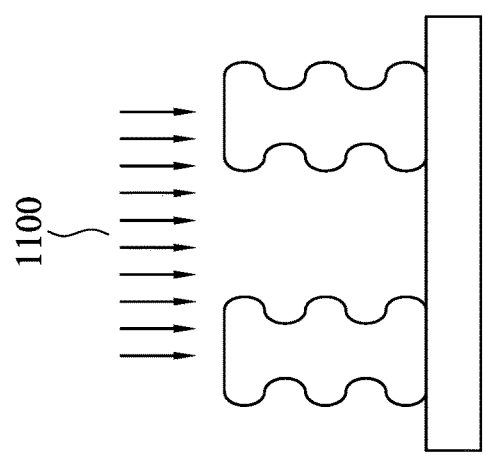
Figure 12:
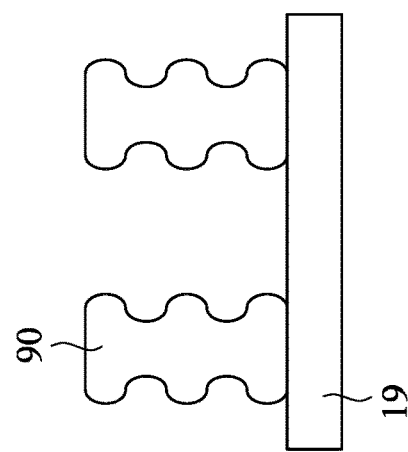

FIGS. 12-14 show a process of removing a standing wave effect in a photo resist pattern by directional etching in accordance with an embodiment of the present disclosure. It is understood that additional operations can be provided before, during, and after processes shown by FIGS. 12-14, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-11B may be employed in the following embodiments, and some of the explanations may be omitted.

In some embodiments, the photo resist layer 90 has a wave profile due to a standing wave effect in an optical lithography. In particular, when the substrate 19 is reflective, the standing wave effect is more observable than when non-reflective substrate is used. After development of the photo resist layer 19, a wavy side profile is obtained as shown in FIG. 12. By applying a directional etching to the photo resist layer 19 as shown in FIG. 13, it is possible to remove the wavy side profile, thereby smoothing a pattern profile, as shown in FIG. 14.

According to the embodiments of the present disclosure, by controlling the beam intensity of directional etching technique, a targeted topography improvement can be achieved. This technique can be applied to photo resist and hard mask profile fine tuning or to remove photo resist scum residue issue, which can largely extend the process window. In particular, a CMP loading issue (uneven surface) can be resolved and an area targeted planarization can be achieved, which reduces manufacturing cost. The process window reduced by a hard mask profile can be largely extended by the application of directional etching process. The pattern defects and/or standing wave effect can be smoothened by application of directional etching process.

In accordance with one aspect of the present disclosure, in a method of manufacturing a semiconductor device, an underlying structure is formed over a substrate. A film is formed over the underlying structure. A surface topography of the film is measured and the surface topography is stored as topography data. A local etching by using directional etching is performed and the substrate is scanned so that an entire surface of the film is subjected to the directional etching. A plasma beam intensity of the directional etching is adjusted according to the topography data. In one or more of the foregoing and following embodiments, in the directional etching, an etching rate along a first axis is greater than an etching rate along a second axis perpendicular to the first axis. In one or more of the foregoing and following embodiments, the etching rate along the first axis is twice or more the etching rate along the second axis. In one or more of the foregoing and following embodiments, the plasma beam intensity is increased as a height of a surface of the film increases. In one or more of the foregoing and following embodiments, a planarization operation is performed on the film. In one or more of the foregoing and following embodiments, the planarization operation is chemical mechanical polishing. In one or more of the foregoing and following embodiments, the film in a dielectric film.

In accordance with another aspect of the present disclosure, in a method of manufacturing a semiconductor device, layout data of an underlying structure formed over a substrate are obtained. A film is formed over the underlying structure. A local etching by using directional etching are performed and the substrate is scanned so that an entire surface of the film is subjected to the directional etching. A plasma beam intensity of the directional etching is adjusted based on layout data. In one or more of the foregoing and following embodiments, in the directional etching, an etching rate along a first axis is greater than an etching rate along a second axis perpendicular to the first axis. In one or more of the foregoing and following embodiments, the etching rate along the first axis is twice or more the etching rate along the second axis. In one or more of the foregoing and following embodiments, a surface topography of the film is estimated based on the layout data. In one or more of the foregoing and following embodiments, the plasma beam intensity is adjusted based on the estimated surface topography. In one or more of the foregoing and following embodiments, the plasma beam intensity is increased as a height of a surface of the film indicated by the estimated surface topography increases. In one or more of the foregoing and following embodiments, a planarization operation is performed on the film. In one or more of the foregoing and following embodiments, the planarization operation is chemical mechanical polishing. In one or more of the foregoing and following embodiments, the film is a dielectric film.

In accordance with another aspect of the present disclosure, in a method of manufacturing a semiconductor device, by a non-contacting sensor, a surface topography of an area of a film formed over a substrate is measured. A local etching on the area is performed by using directional etching. A plasma beam intensity of the directional etching is adjusted according to the measured surface topography. The measuring the surface topography and the performing the local etching are performed by moving the substrate relative to the non-contacting sensor and the plasma beam. In one or more of the foregoing and following embodiments, in the directional etching, an etching rate along a first axis is greater than an etching rate along a second axis perpendicular to the first axis. In one or more of the foregoing and following embodiments, the etching rate along the first axis is five times or more the etching rate along the second axis. In one or more of the foregoing and following embodiments, the plasma beam intensity is increased as a height of a surface of the film indicated by the measured surface topography increases. In one or more of the foregoing and following embodiments, the non-contacting sensor is an optical beam.

In accordance with another aspect of the present disclosure, in a method of manufacturing a semiconductor device, a first hard mask is formed over an underlying layer on a substrate by a photolithographic and etching operation. A second hard mask is formed over the first hard mask by a photolithographic and etching operation. A sidewall portion of the first hard mask is etched. In one or more of the foregoing and following embodiments, during the etching of the sidewall portion of the first hard mask, the second hard mask is not etched. In one or more of the foregoing and following embodiments, during the etching of the sidewall portion of the first hard mask, the second hard mask is etched in an amount less than the first hard mask. In one or more of the foregoing and following embodiments, the etching of the sidewall portion of the first hard mask is performed by directional etching. In one or more of the foregoing and following embodiments, before the etching, the first hard mask has a first width and the second hard mask has a second width smaller than the first width. In one or more of the foregoing and following embodiments, after the etching, the first width is reduced. In one or more of the foregoing and following embodiments, after the etching, the second width is not reduced. In one or more of the foregoing and following embodiments, after the etching, the second width is reduced in an amount less than the first width. In one or more of the foregoing and following embodiments, the second width has a value in a range from 0.5 nm to 5 nm.

In accordance with another aspect of the present disclosure, in a method of manufacturing a semiconductor device, a photoresist pattern is formed over an underlying layer on a substrate by a photolithographic and etching operation. A sidewall portion of the first hard mask is etched by irradiation with radiation. In one or more of the foregoing and following embodiments, the photoresist pattern includes wavy surface. In one or more of the foregoing and following embodiments, the etching removes protrusions of the wavy surface and smoothens the wavy surface. In one or more of the foregoing and following embodiments, the radiation has an intensity profile over the sidewall portion of the first hard mask. In one or more of the foregoing and following embodiments, the intensity profile is opposite of a surface topography profile of the sidewall portion. In one or more of the foregoing and following embodiments, the radiation is emitted at an oblique angle with respect to a surface of the substrate. In one or more of the foregoing and following embodiments, the radiation is UV light.

In accordance with another aspect of the present disclosure, in a pattern formation method, patterns are formed over a substrate. A defect inspection is performed to detect one or more defects. A directional etching operation is performed on one or more areas including the detected one or more defects to remove the one or more defects.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    obtaining layout data of an underlying structure formed over a substrate;
    forming a film over the underlying structure;
    estimating a surface topography of the film based on the layout data; and
    performing a local etching by using directional etching, while scanning the substrate, so that an entire surface of the film is subjected to the directional etching,
    wherein the plasma beam intensity is adjusted based on the estimated surface topography.

2. The method of claim 1, wherein in the directional etching, an etching rate along a first axis is greater than an etching rate along a second axis perpendicular to the first axis.

3. The method of claim 2, wherein the etching rate along the first axis is twice or more the etching rate along the second axis.

4. The method of claim 1, wherein the plasma beam intensity is increased as a height of a surface of the film indicated by the estimated surface topography increases.

5. The method of claim 1, further comprising performing a planarization operation on the film.

6. The method of claim 5, wherein the planarization operation is chemical mechanical polishing.

7. The method of claim 1, wherein the film is a dielectric film.

8. A method of manufacturing a semiconductor device, comprising:
    obtaining layout data of an underlying structure formed over a substrate;
    forming a film over the underlying structure; and
    performing a local etching by using directional etching, wherein a plasma beam intensity of the directional etching is adjusted based on the layout data.

9. The method of claim 8, wherein in the directional etching, an etching rate along a first axis is greater than an etching rate along a second axis perpendicular to the first axis.

10. The method of claim 9, wherein the etching rate along the first axis is twice or more the etching rate along the second axis.

11. The method of claim 8, wherein the plasma beam intensity is increased as a height of a surface of the film indicated by the layout data increases.

12. The method of claim 8, further comprising performing a planarization operation on the film.

13. The method of claim 12, wherein the planarization operation is chemical mechanical polishing.

14. The method of claim 8, wherein the film is a dielectric film.

15. A method of manufacturing a semiconductor device, comprising:
    obtaining layout data of an underlying structure formed over a substrate;
    forming a film over the underlying structure;
    estimating a surface topography of the film based on the layout data and at least one of a thickness of the film or a material of the film; and
    performing a local etching by using directional etching, while scanning the substrate,
    wherein the plasma beam intensity is adjusted based on the estimated surface topography.

16. The method of claim 15, wherein in the directional etching, an etching rate along a first axis is greater than an etching rate along a second axis perpendicular to the first axis.

17. The method of claim 16, wherein the etching rate along the first axis is five times or more the etching rate along the second axis.

18. The method of claim 15, wherein the plasma beam intensity is increased as a height of a surface of the film indicated by the measured surface topography increases.

19. The method of claim 16, wherein the film is a dielectric film.

20. The method of claim 15, further comprising performing a chemical mechanical polishing operation.

* * * * *